United States Patent [19]

Higuchi

[11] Patent Number: 5,331,600

[45] Date of Patent: Jul. 19, 1994

[54] NON-VOLATILE PROGRAMMABLE READ ONLY MEMORY DEVICE HAVING WRITE-IN UNIT SEQUENTIALLY WRITING DATA BITS INTO MEMORY CELLS FOR PROGRAMMING

[75] Inventor: Misao Higuchi, Tokyo, Japan

[73] Assignee: Nec Corporation, Tokyo, Japan

[21] Appl. No.: 705,595

[22] Filed: May 24, 1991

[30] Foreign Application Priority Data

May 31, 1990 [JP] Japan .................................. 2-142514

[51] Int. Cl.$^5$ .................................................. G11C 8/00
[52] U.S. Cl. .......................... 365/230.04; 365/189.02; 365/194
[58] Field of Search .............. 365/185, 189.01, 189.02, 365/194, 220, 230.04, 230.06

[56] References Cited

U.S. PATENT DOCUMENTS

| | | | |
|---|---|---|---|
| 4,680,738 | 7/1987 | Tam | 365/239 |
| 4,763,302 | 8/1988 | Yamada | 365/230.04 |
| 4,841,488 | 6/1989 | Sanada | 365/233 |
| 4,849,937 | 7/1989 | Yoshimoto | 365/189.05 |
| 5,027,326 | 6/1991 | Jones | 365/221 |
| 5,040,149 | 8/1991 | Ebihara et al. | 365/189.05 |
| 5,121,360 | 6/1992 | West et al. | 365/230.03 |

Primary Examiner—Timothy P. Callahan
Assistant Examiner—Terry D. Cunningham
Attorney, Agent, or Firm—Leydig, Voit & Mayer

[57] ABSTRACT

An electrically programmable read only memory device is equipped with a plurality of write-in circuits for concurrently writing a plurality of data bits into memory cells, wherein a write-in controlling unit sequentially produces a plurality of write-in controlling signals supplied to a transfer gate groups for sequentially transferring the data bits to column selectors associate with memory cell blocks so that the peak current in the write-in operation is not increased together with the number of the data bits concurrently written into the memory cells.

8 Claims, 5 Drawing Sheets

FIG.5

NON-VOLATILE PROGRAMMABLE READ ONLY MEMORY DEVICE HAVING WRITE-IN UNIT SEQUENTIALLY WRITING DATA BITS INTO MEMORY CELLS FOR PROGRAMMING

FIELD OF THE INVENTION

This invention relates to a programmable read only memory device and, more particularly, to a write-in unit incorporated therein for writing data bits into memory cells.

DESCRIPTION OF THE RELATED ART

The number of memory cells integrated in the programmable read only memory device such as an EPROM (Electrically Programmable Read Only Memory) is on the increase from year to year, and, accordingly, programming requires longer time periods. In order to shrink the programming, two approaches have been proposed.

The first approach is using a narrow write-in pulse for every write-in operation, and a data is written into memory cell within a short time period. If the write-in pulse is decreased from 1 millisecond to 0.1 millisecond, the programming would be completed within extremely short time period rather than the wide write-in pulse.

The second approach is that a plurality of data bits are concurrently written into memory cells in a single write-in operation. Even if the write-in pulse is wider than that used in the first approach, the programming is surely shrunk through the second approach.

Comparing the first approach with the second approach, the first approach is less desirable than the second approach, because the data bits written into the memory cells are destructible. In order to fabricate a floating gate type memory cell capable of storing a non-destructible data bit with a narrow write-in pulse, a new process sequence is needed, and is less desirable in view of applicability of current technology.

Figure 1:
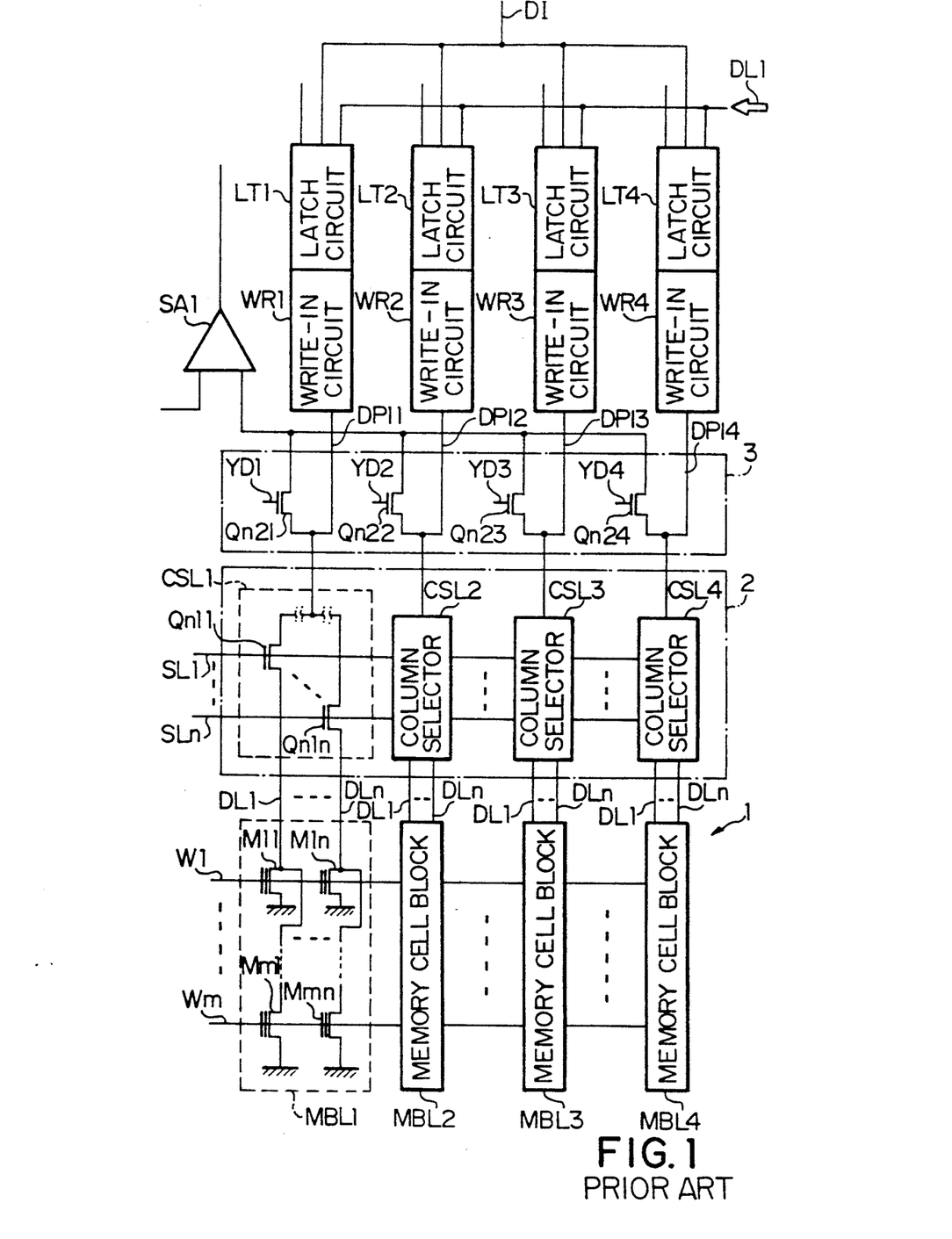
FIG. 1 is a block diagram showing the arrangement of the prior art electrically programmable read only memory device.

FIG. 1 shows a prior art electrically programmable read only memory device to which the second approach is applied. The electrically programmable read only memory device comprises a memory cell array I divided into four memory cell blocks 1 to 4, and the memory cell array I is arranged in rows and columns. Each of the memory cell blocks MBL1, MBL2, MBL3 and MBL4 has a plurality of memory cells M11, M1n, Mm1 and Mmn, and the memory cells M11 to Mmn are of the floating gate type. Word lines W1 to Wm are shared with the four memory cell blocks 1 to 4, and each of the word lines W1 to Wm is coupled to the control gate electrodes of the memory cells M11 to Mmn in each row. The word lines W1 to Wm are selectively driven by a row address decoder unit (not shown), and the memory cells coupled to the selected word line is read for access or write-in operation.

Digit lines DL1 to DLn are coupled to the drain nodes of the memory, cells M11 to Mmn in the respective columns of each memory cell block MBL1, MBL2, MBL3 or MBL4, and are terminated at a column selecting unit 2. The column selecting unit 2 comprises four column selectors CSL1, CSL2, CSL3 and CSL4 which are respectively associated with the four memory cell blocks MBL1 to MBL4. Each of the column selectors CSL1 to CSL4 is implemented by a plurality of n-channel type field effect transistors Qn11 to Qn1n respectively coupled to the digit lines DL1 to DLn, and column selecting lines SL1 to SLn are respectively coupled to the gate electrodes of the n-channel type field effect transistors Qn11 to Qn1n of the individual column selectors CSL1 to CSL4. Though not shown in the drawings, the column selecting lines SL1 to SLn are coupled to a column address decoder unit, and the column address decoder unit selectively drives the column selecting lines SL1 to SLn to an active high level.

A shifting unit 3 is coupled to the column selecting unit 2 and has four n-channel type field effect transistors Qn21, Qn22, Qn23 and Qn24 as well as four data paths DP11, DP12, DP13 and DP14. The n-channel type field effect transistors Qn21 to Qn24 selectively turn on with mode selecting signal lines YD1, YD2, YD3 and YD4 so that one of the column selectors CSL1 to CSL4 is coupled to a sense amplifier circuit SA1. The four data paths DP11 to DP14 are coupled to four write-in circuits WR1, WR2, WR3 and WR4 associated with four data latching circuits LT1, LT2, LT3 and LT4, respectively, and write-in data bits are supplied from an input data port to the data latching circuits LT1 to LT4. Namely, the data latching circuits LT1 to LT4 are responsive to a latching signal DL1, and four write-in data bits are stored in the data latching circuits LT1 to LT4.

When the electrically programmable read only memory device enters a write-in mode of operation, four write-in data bits are provided to the data latching circuits LT1 to LT4, and the mode selecting signal lines YD1 to YD4 cause the n-channel type field effect transistors Qn21 to Qn24 to remain off. The column selecting unit 2 selects a column of the memory cells M11 to Mmn from every memory cell block MBL1 to MBL4, and one of the word lines allows four memory cells in the same row to be ready for the write-in operation.

Then, the four write-in circuits WR1 to WR4 selectively supply write-in pulse of an extremely high voltage level to the data paths DP11 to DP14 on the basis of the write-in data bits, and the four data bits are simultaneously written into the selected four memory cells of the respective four memory cell blocks MBL1 to MBL4.

The prior art electrically programmable read only memory device thus arranged hardly copes with increase of memory cells in future. Namely, if the number of write-in data bits concurrently written into the memory cells is increased, a large amount of current is instantaneously consumed in every write-in operation, and undesirable fluctuation of power voltage level takes place. For example, a write-in operation on a single data bit is assumed to consume 2 milliamperes, and the prior art electrically programmable read only memory device shown in FIG. 1 consumes 8 milliamperes in a single write-in operation. However, if eight data bits or a single data byte is concurrently written into eight memory cells, the peak current is estimated at 16 milliamperes. A write-in operation on four data bytes increases the peak current to 64 milliamperes.

SUMMARY OF THE INVENTION

It is therefore an important object of the present invention to provide a non-volatile programmable read only memory device which concurrently writes a large number of data bits into memory cells without large peak current.

To accomplish these objects, the present invention proposes to introduce time delay between write-in signals.

In accordance with the present invention, there is provided a non-volatile programmable read only memory device having a plurality of emory cells arranged in rows and columns and divided into a plurality of memory cell blocks each including columns of the memory cells. A plurality of word lines are coupled to the rows of the memory cells and driven for selecting one of the rows of the memory cells. A plurality of column selectors are respectively associated with the memory cell blocks. Each of the column selectors is responsive to a column selecting signal for selecting a column of the memory cells from the associated memory cell block. A plurality of data latching circuits are included for storing a plurality of write-in data bits, respectively. A plurality of write-in circuits are associated with the plurality of data latching circuits and respectively generate a plurality of write-in signals. Each write-in signal being indicative of a respective one of the respective write-in data bits. The plurality of write-in signals are supplied to the column selectors, respectively. A write-in controlling unit is provided which is responsive to an external controlling signal and sequentially produces a plurality of write-controlling signals so that a time delay is introduced between the plurality of write-in controlling signals. A transfer gate array is coupled between the plurality of write-in circuits and the plurality of column selectors. The transfer gate array includes a plurality of transfer transistors divided into a plurality of transfer gate groups. The transfer gate groups are respectively responsive to the plurality of write-in controlling signals for sequentially transferring the write-in signals to the plurality of column selectors.

BRIEF DESCRIPTION OF THE DRAWINGS

The features and advantages of the non-volatile programmable semiconductor memory device according to the present invention will be more clearly understood from the following description taken in conjunction with the accompanying drawings in which.

DESCRIPTION OF THE PREFERRED EMBODIMENTS

First Embodiment

Figure 2:
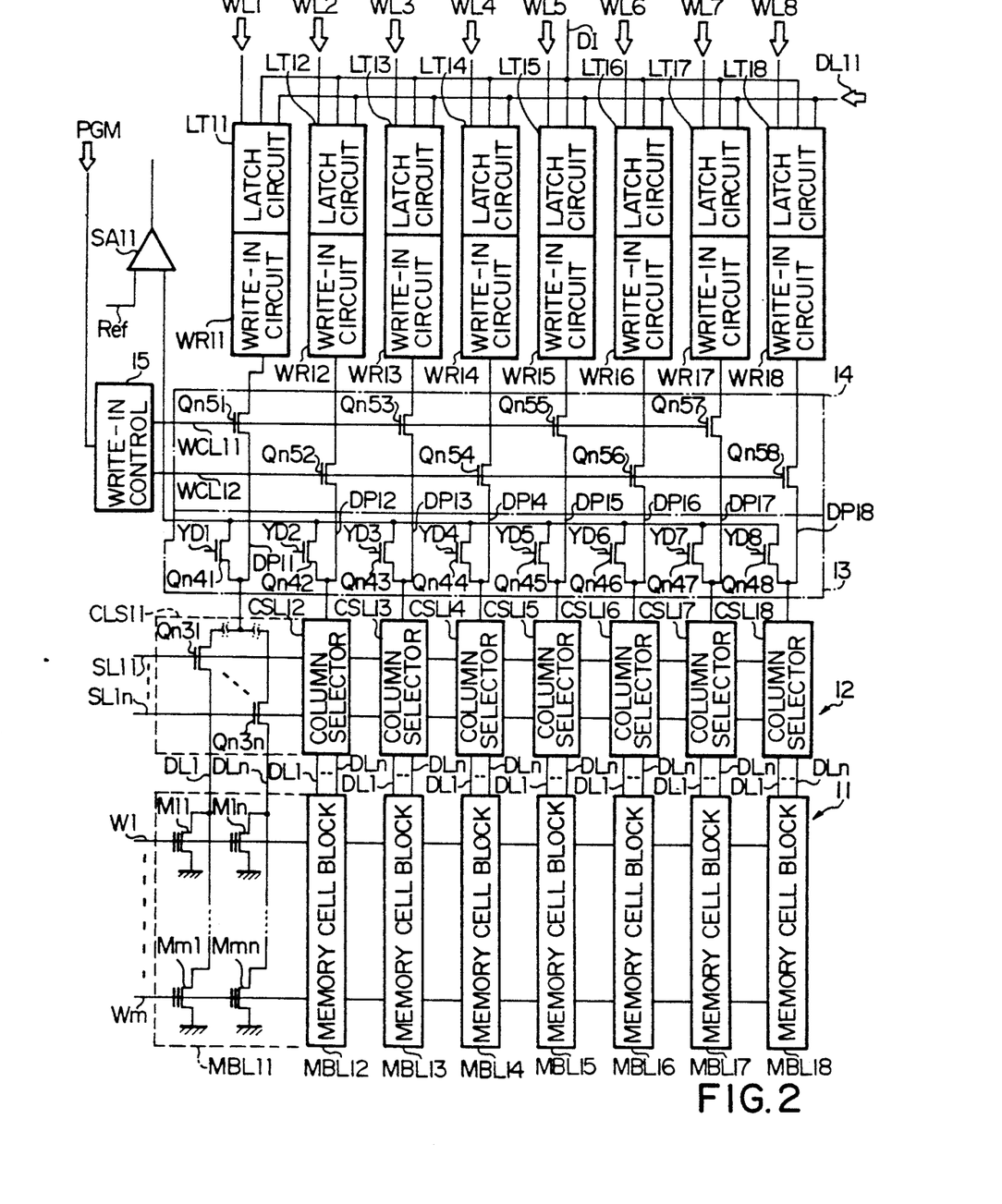
FIG. 2 is a block diagram showing the arrangement of an electrically programmable read only memory device according to the present invention.

Referring to FIG. 2 of the drawings, an electrically programmable read only memory device embodying the present invention comprises a memory cell array 11 including eight memory cell blocks MBL11, MBL12, MBL13, MBL14, MBL15, MBL16, MBL17 and MBL18. Each of the memory cell blocks MBL11 to MBL18 is implemented by a plurality of memory cells M11, M1n, Mm1 and Mmn arranged in rows and columns, and the memory cells M11 to Mmn are of the floating gate type. Upon application of a reverse bias between the drain node and the substrate, avalanche breakdown takes place around the drain, and hot electrons are injected into the floating gate electrode for memorizing a data bit. A plurality of word lines W1 to Wm are respectively associated with the rows of the memory cells of the memory cell blocks MBL1 1 to MBL18 and coupled to the control gate electrodes of the memory cells. A row address decoder unit (not shown) allows one of the word lines W1 to Wm to go up to an active high voltage level, and the word line thus selected by the row address decoder unit makes the memory cells of the memory cell blocks MBL11 to MBL18 coupled thereto accessible in a read-out mode of operation and rewriteable in a programming mode of operation.

Each of the memory cell blocks MBL11 to MBL18 is associated with n digit lines DL1 to DLn which are coupled to the columns of the memory cells M11 to Mmn, respectively. The memory cell blocks MBL11 to MBL18 are further associated with a plurality of column selectors which as a whole constitute a column selecting unit 12. Each of the column selectors CSL11 to CSL18 has n-channel type field effect transistors Qn31 to Qn3n coupled to the associated digit lines DL1 to DLn, respectively, and are responsive to column selecting signals on signal lines SL11 to SL1n. Namely, a column address decoder unit (not shown) drives one of the column selecting signal lines SL11 to SL1n, and allows the n-channel type field effect transistors respectively selected from the column selectors CSL11 to CSL18 to concurrently turn on.

The column selectors CSL11 to CSL18 are associated with a shifting unit 13 which comprises n-channel type field effect transistors Qn41, Qn42, Qn43, Qn44, Qn45, Qn46, Qn47 and Qn48 and data paths DP11, DP12, DP13, DP14, DP15, DP16, DP17 and DP18 respectively paired with the n-channel type field effect transistors Qn41 to Qn48. The n-channel type field effect transistors Qn41 to Qn48 thus respectively paired with the data paths DL11 to DL18 are coupled to the column selectors CSL11 to CSL18, respectively, and the n-channel type field effect transistors Qn41 to Qn48 are responsive to mode selecting signal lines YD1, YD2, YD3, YD4, YD5, YD6, YD7 and YD8 for interconnecting the column selectors CSL11 to CSL18 to a sense amplifier circuit SA11. On the other hand, the data paths DP11 to DP18 are coupled to a transfer gate array 14, and the transfer gate array 14 comprises n-channel type transfer gate transistors Qn51, Qn52, Qn53, Qn54, Qn55, Qn56, Qn57 and Qn58. The n-channel type transfer gate transistors Qn51 to Qn58 are divided into two transfer gate groups, and the transfer gate groups are controlled with first and second write-in controlling signals on signal lines WCL11 and WCL12. In this instance, the n-channel type transfer transistors Qn51, Qn53, Qn55 and Qn57 form in combination the first transfer gate group, and the second transfer gate group is constituted by the n-channel type transfer transistors Qn52, Qn54, Qn56 and Qn58.

The first and second write-in controlling signals are produced by a write-in controlling unit 15, and an external control signal PGM of an active low voltage level is supplied to the write-in controlling unit 15. Though not shown in the drawings, the write-in controlling unit 15 is implemented by two series combinations of inverting circuits, and the two series combinations produces the first and second write-in controlling signals of an active high voltage level. Since the number of the inverting circuits of one series combination is smaller than that of the other series combination, time delay is introduced between the first and second write-in controlling signals.

The n-channel type transfer transistors Qn51 to Qn58 are respectively coupled to write-in circuits WR11, WR12, WR13, WR14, WR15, WR16, WR17 and WR18 which in turn are coupled to latching circuits LT11, LT12, LT13, LT14, LT15, LT16, LT17 and LT18, respectively. The latching circuits LT11 to LT18 are supplied with selecting signals WL1, WL2, WL3, WL4, WL5, WL6, WL7 and WL8, respectively, and an strobe signal DL11 is supplied to all of the latching circuits LT11 to LT18. An input data line DI is shared between all of the latching circuits LT11 to LT18, and a write-in data bit is fetched by one of the latching circuits LT11 to LT18 in the co-presence of the associated selecting signal WL1, WL2, WL3, WL4, WL5, WL6, WL7 or WL8 and the strobe signal DL11. Though not shown in the drawings, a decoder unit is provided for the latching circuits LT11 to LT18, and the decoder unit selectively produces the selecting signals WL1 to WL8 on the basis of predetermined address bits A0 to A2.

Description is made on circuit behavior of the electrically programmable read only memory device. If the electrically programmable read only memory device enters the read-out mode of operation, one of the word lines W1 to Wm goes up to the active high voltage level, and one of the column selecting signal lines SL11 to SL1n also goes up to the active high voltage level. Then, one of the memory cells M11 to Mmn is selected from each of the memory cell blocks MBL11 to MBL18, and eight memory cells are conducted to the shifting unit 13. One of the mode selecting signals YD1 to YD8 goes up to the active high voltage level, and the sense amplifier circuit SA11 is coupled through the shifting unit 13 to one of the eight memory cells. Current flows from the sense amplifier circuit SA11 through the shifting unit 13 and one of the column selectors CSL11 to CSL18 to one of the eight memory cells. If hot electrons have been injected, no conductive channel takes place in the memory cell even if the associated word line goes up to the active high voltage level. However, if no hot electron is injected, a conductive channel takes place for discharging the current to the ground line. Thus, voltage level at the data input node of the sense amplifier circuit SA11 is changed depending upon the data bit memorized in the accessed memory cell. The sense amplifier circuit SA11 compares the voltage level at the data input node with a reference voltage level Ref, and produces an output data signal indicative of the data bit memorized in the accessed memory cell.

However, if the programming mode is established in the electrically programmable read only memory device at time t1 (see FIG. 3), all of the mode selecting signals YD1 to YD8 go down to the inactive low voltage level, and all of the n-channel type field effect transistors Qn41 to Qn48 turn off. Then, the column selectors CSL11 to CSL18 are conducted through the data paths DP11 to DP18 to the transfer gate array 14.

Figure 3:
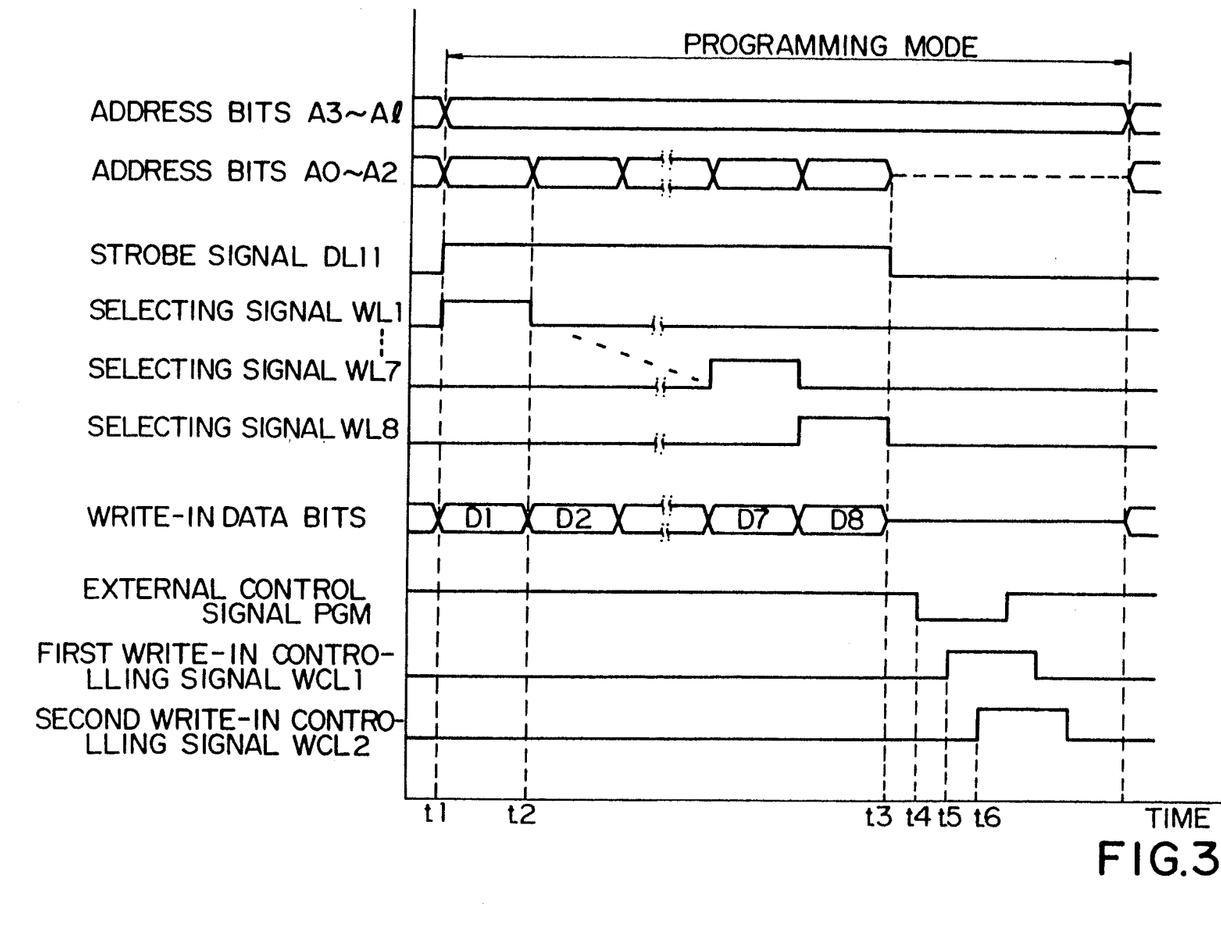
FIG. 3 is a timing chart showing the sequence of a write-in operation for programming the electrically programmable read only memory device shown in FIG. 2.

At time t1, the predetermined address bits A0 to A2 designate the latching circuit LT11, and, accordingly, the decoder unit (not shown) produces the selecting signal WL1. Since the strobe signal DL11 is shifted to the active high voltage level, the write-in data bit D1 is latched by the latching circuit LT11 in the co-presence of the selecting signal WL1 and the strobe signal DL11.

From time t2 to time t3, the predetermined address bits A0 to A2 sequentially designate the latching circuit LT12 to LT18, and the decoder changes the selecting signal of the active high voltage level. The write-in data bits D2 to D8 are supplied to the input data line DI in synchronism with the charge of the predetermined address bits A0 to A2, and are sequentially latched by the latching circuits LT12 to LT18. If the eight write-in data bits D1 to D8 are memorized in the latching circuits LT11 to LT18 at time t3, the strobe signal DL11 is recovered to the inactive low voltage level. The write-in data bits D1 to D8 are supplied to the write-in controlling circuits WR11 to WR18, and the write-in controlling circuits WR11 to WR18 produce write-in signals indicative of the write-in data bits, respectively. If the write-in data bit is logic "1" level, the write-in signal goes up to an extremely high voltage level higher than the active high voltage level. However, if the write-in data bit is logic "0" level, the write-in signal remains in the ground voltage level.

The other address bits A3 to A1 have been decoded by the row address decoder unit and the column address decoder unit, and eight memory cells are designated by the word lines W1 to Wm and the column selecting signal lines SL11 to SL1n. The external controlling signal PGM goes down to the active low voltage level at time t4, and the write-in controlling unit 15 firstly shifts the first write-in controlling signal line WCL11 to the active high voltage level at time t5. Then, the first group of the n-channel type transfer transistors Qn51, Qn53, Qn55 and Qn57 concurrently turn on, and the write-in signals are transferred from the write-in circuits WR11, WR13, WR15 and WR17 through the data paths DP11, DP13, DP15 and DP17 and column selectors CSL11, CSL13, CSL15 and CSL17 to the memory cells selected from the memory cell blocks MBL11, MBL13, MBL15 and MBL17, respectively.

At time t6, the second write-in controlling signal WCL2 goes up to the active high voltage level, and the second group of the n-channel type transfer transistors Qn52, Qn54, Qn56 and Qn58 concurrently turn on, and the write-in signals are transferred from the write-in circuits WR12, WR14, WR16 and WR18 through the data paths DP 12, DP14, DP16 and DP18 and column selectors CSL12, CSL14, CSL16 and CSL18 to the memory cells selected from the memory cell blocks MBL12, MBL14, MBL16 and MBL18, respectively. Since the second write-in controlling signal WCL2 is slightly delayed from the first write-in controlling signal WCL1, the peak current is relatively small rather than that of an electrically programmable read only memory device concurrently writing all of the write-in data bits. However, the first and second write-in controlling signals WCL1 and WCL2 are overlapped with each other, and, for this reason, the programming mode is not so prolonged.

Second Embodiment

Figure 4:
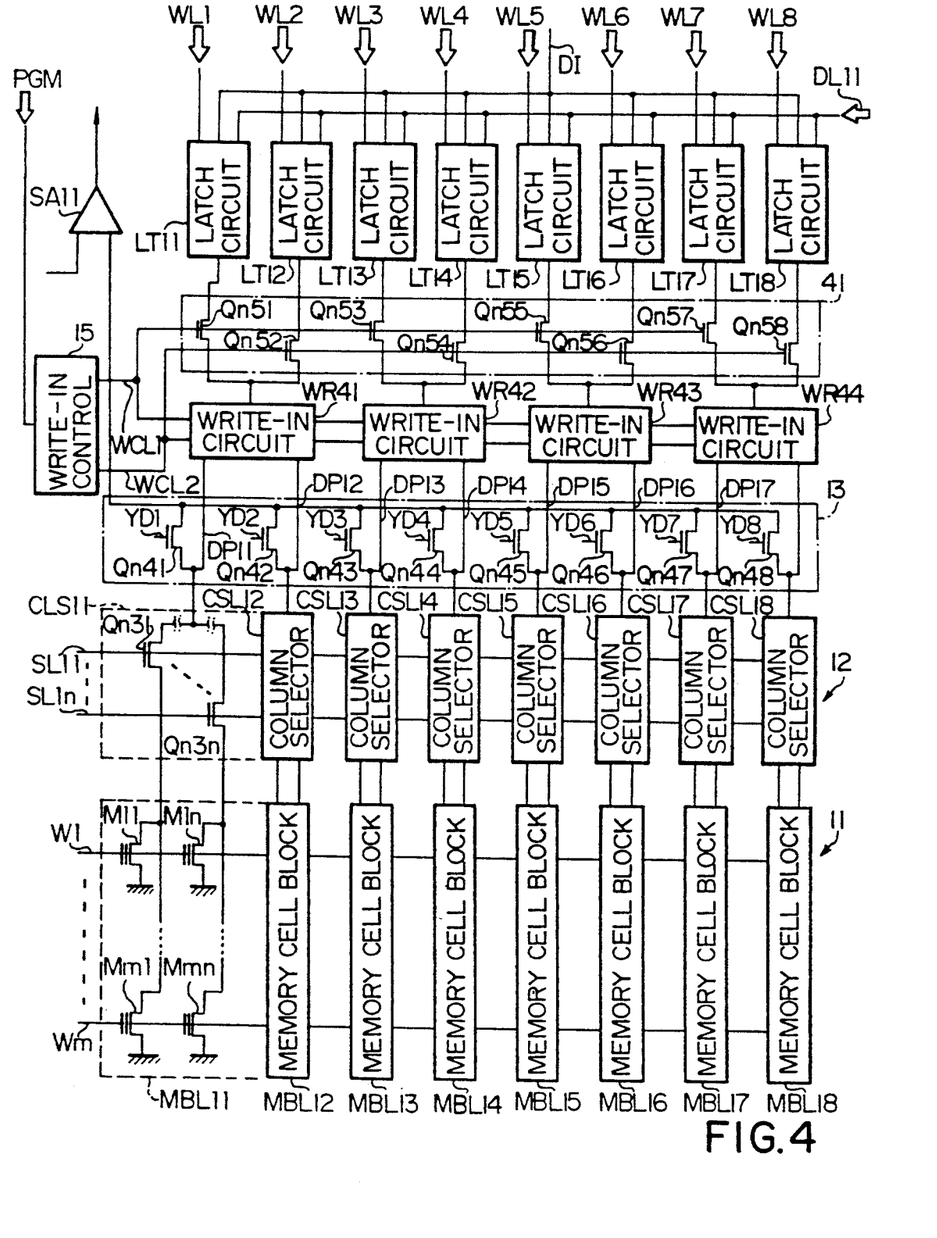
FIG. 4 is a block diagram showing the arrangement of another electrically programmable read only memory device according to the present invention.

Turning to FIG. 4 of the drawings, another electrically programmable read only memory device embodying the present invention is illustrated. The electrically programmable read only memory device shown in FIG. 4 is slightly different from the first embodiment. Namely, a transfer gate array 41 is coupled between the latching circuits LT11 to LT18 and four write-in circuits WR41, WR42, WR43 and WR44. However, the other arrangement is similar to that of the first embodiment, and, for this reason, component units and transistors are designated by the same references used for the first embodiment without detailed description.

The transfer gate array 41 also comprises n-channel type transfer transistors Qn51 to Qn58 divided into first and second transfer gate groups as similar to the first embodiment. The latching circuits LT11, LT13, LT15 and LT17 are respectively paired with the latching circuits LT12, LT14, LT16 and LT18 so that four latching circuit pairs are formed. The four latching circuit pairs are respectively associated with the four write-in circuits WR41, WR42, WR43 and WR44, and one of the latching circuits of each latching circuit pair is coupled through the transfer gate array 41 to the associated write-in circuit in the programming mode of operation. Each of the write-in circuits WR41 to WR44 is provided in association with every two column selectors CSL11 and CSL12, CSL13 and CSL14, CSL15 and CSL16, or CSL17 and CSL18, and has two output nodes coupled to the associated two column selectors. Each of the write-in circuits supplies the write-in signal to one of the output nodes upon application of a write-in data bit from one of the associated latching circuits. However, the write-in circuit automatically changes the output node, and supplies the write-in signal to the other output node when the next write-in data is fed from the other associated latching circuit. As discussed above with regard to Qn51 to Qn58, such a function may be accomplished using n-channel transfer transistors coupled to the input/output of a conventional write-in circuit, as is well known in the art. In other words, when the latching circuit for supplying the write-in data bit to the write-in circuit is changed with the write-in controlling signals WCL1 and WCL2, the write-in circuit also changes the output node coupled with the input node thereof with the write-in controlling signals WCL1 and WCL2.

In the second embodiment, only four write-in circuits WR41 to WR44 carry out a programming with write-in data bits fed from the eight latching circuits LT11 to LT18, the number of peripheral circuits are decreased rather than the first embodiment.

Figure 5:
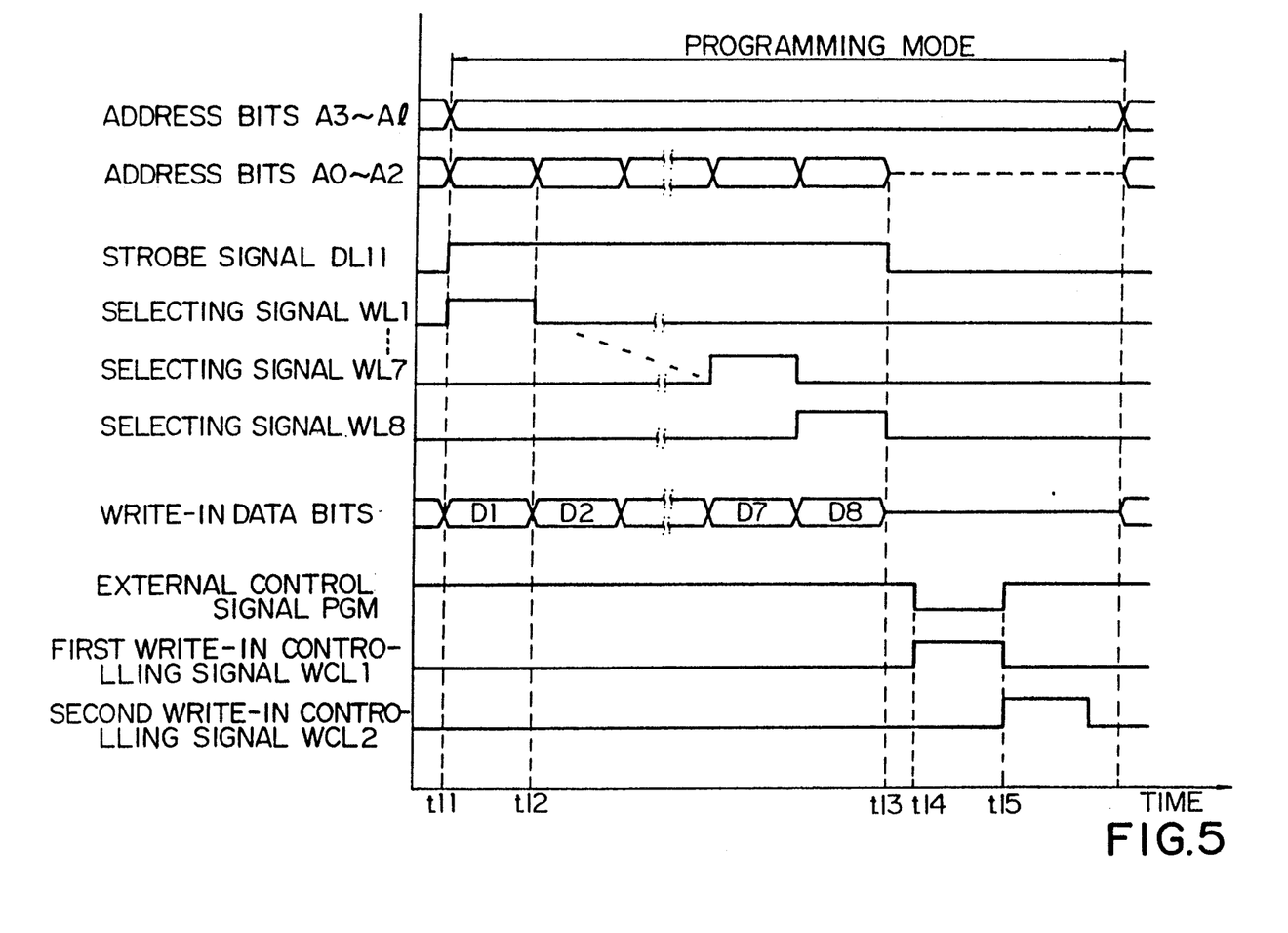
FIG. 5 is a timing chart showing the sequence of a write-in operation for programming the electrically programmable read only memory device shown in FIG. 4.

The circuit behavior of the second embodiment is hereinbelow described with reference to FIG. 5. In the read-out mode of operation, the electrically programmable read only memory device behaves as similar to the first embodiment, and no description on the read-out mode of operation is incorporated.

If the programming mode is established in the electrically programmable read only memory device at time t11, all of the mode selecting signals YD1 to YD8 go down to the inactive low voltage level, and all of the n-channel type field effect transistors Qn41 to Qn48 turn off. Then, the column selectors CSL11 to CSL18 are conducted through the data paths DP11 to DP18 to the transfer gate array 14.

At time t11, the predetermined address bits A0 to A2 designate the latching circuit LT11, and, accordingly, the decoder unit (not shown) produces the selecting signal WL1. Since the strobe signal DL11 is shifted to the active high voltage level, the write-in data bit D1 is latched by the latching circuit LT11 in the co-presence of the selecting signal WL1 and the strobe signal DL11.

From time t12 to time t13, the predetermined address bits A0 to A2 sequentially designate the latching circuit LT12 to LT18, and the decoder changes the selecting signal of the active high voltage level. The write-in data bits D2 to D8 are supplied to the input data line DI in synchronism with the charge of the predetermined address bits A0 to A2, and are sequentially latched by the latching circuits LT12 to LT18. If the eight write-in data bits D1 to D8 are memorized in the latching circuits LT11 to LT18 at time t13, the strobe signal DL11 is recovered to the inactive low voltage level.

The other address bits A3 to A1 have been decoded by the row address decoder unit and the column address decoder unit, and eight memory cells are designated by the word lines W1 to Wm and the column selecting signal lines SL11 to SL1n. The external controlling signal PGM goes down to the active low voltage level at time t14, and the write-in controlling unit 15 firstly shifts the first write-in controlling signal line WCL11 to the active high voltage level. Then, the first group of the n-channel type transfer transistors Qn51, Qn53, Qn55 and Qn57 concurrently turn on, and the write-in data bits are transferred from the latching circuits LT1 I, LT13, LT15 and LT17 through the transfer gate array 41 to the write-in circuits WR41 to WR44. The write-in circuits WR41 to WR44 respectively produce the write-in signals each either extremely high or ground voltage level, and the write-in signals are supplied from the write-in circuits WR41 to WR44 through the data paths DP11, DP13, DP15 and DP17 and the column selectors CSL11, CSL13, CSL15 and CSL17 to the four memory cells selected from the memory cell blocks MBL11, MBL13, MBL15 and MBL17, respectively.

At time t15, the first write-in controlling signal WCL1 is recovered to the inactive low voltage level, and the second write-in controlling signal WCL2 goes up to the active high voltage level. Then, the second group of the n-channel type transfer transistors Qn52, Qn54, Qn56 and Qn58 concurrently turn on, and the write-in data bits are transferred from the latching circuits LT12, LT14, LT16 and LT18 through the transfer gate array 41 to the write-in circuits WR41 to WR44. The write-in circuits WR41 to WR44 produces the write-in signals again on the basis of the write-in data bits newly supplied thereto. The write-in signals thus produced are fed through the data paths DP12, DP14, DP16 and DP18 and column selectors CSL12, CSL14, CSL16 and CSL18 to the other four memory cells selected from the memory cell blocks MBL12, MBL14, MBL16 and MBL18, respectively. Since the second write-in controlling signals WCL1 and WCL2 are alternatively shifted to the active high voltage level, the peak current is relatively small rather than that of an electrically programmable read only memory device concurrently writing all of the write-in data bits.

Although particular embodiments of the present invention have been shown and described, it will be obvious to those skilled in the art that various changes and modifications may be made without departing from the spirit and scope of the present invention. For example, the present invention is applicable to an electrically erasable and programmable read only memory device as well as a programmable read only memory device implemented by diode array selectively broken with large current. Moreover, the memory cell blocks may be more than eight, and, accordingly, a write-in operation is sequentially carried out on more than eight bits. In the first and second embodiments, the write-in data bits are divided into two groups; however, another non-volatile semiconductor memory device according to the present invention divides write-in data bits into more than two groups.

What is claimed is:

1. A non-volatile programmable read only memory device comprising:
    a) a plurality of memory cells arranged in rows and columns and divided into a plurality of memory cell blocks each including columns of said memory cells;
    b) a plurality of word lines coupled to said rows of said memory cells and driven for selecting one of said rows of said memory cells;
    c) a plurality of column selectors respectively associated with said memory cell blocks, each of said column selectors being responsive to a column selecting signal for selecting a column of said memory cells from said associated memory cell block;
    d) a plurality of data latching circuits for storing a plurality of write-in data bits, respectively;
    e) a plurality of write-in circuits respectively coupled to said plurality of data latching circuits and respectively generating a plurality of write-in signals each being indicative of a respective one of said respective write-in data bits, said plurality of write-in signals being supplied to said column selectors, respectively;
    f) a write-in controlling unit responsive to an external controlling signal and sequentially producing a plurality of write-in controlling signals, wherein a time delay is introduced between said plurality of write-in controlling signals; and
    g) a transfer gate array coupled between said plurality of write-in circuits and said plurality of column selectors, said transfer gate array having a plurality of transfer transistors divided into a plurality of transfer gate groups, said transfer gate groups being respectively response to said plurality of write-in controlling signals for sequentially transferring said write-in signals to said plurality of column selectors.

2. The non-volatile programmable read only memory device as set forth in claim 1 wherein said write-in circuits are coupled between said latching circuits and said transfer gate array, said transfer gate array propagating said write-in signals.

3. The non-volatile programmable read only memory device as set forth in claim 2 wherein said write-in controlling signals are partially overlapped with each other.

4. The non-volatile programmable read only memory device as set forth in claim 3 in which said non-volatile programmable read only memory device further comprises a shifting unit coupled between said transfer gate array and said column selectors, said shifting unit being operative to propagate said write-in signals to said column selectors, respectively, in a programming mode, said shifting unit being further operative to transfer data bits from one of said column selectors to a sense amplifier circuit.

5. A non-volatile programmable read only memory device comprising:
    a) a plurality of memory cells arranged to tows and columns and divided into a plurality of memory cell blocks each including columns of said memory cells;
    b) a plurality of word lines coupled to said rows of said memory cells and driven for selecting one of said rows of said memory cells;
    c) a plurality of column selectors respectively associated with said memory cell blocks, each of said column selectors being responsive to a column selecting signal for selecting a column of said memory cells from said associated memory cell block;
    d) a plurality of data latching circuits for storing a plurality of write-in data bits, respectively;
    e) a plurality of write-in circuits associated with said plurality of data latching circuits and respectively generating a plurality of write-in signals each being indicative of a respective one of said respective write-in data bits, said plurality of write-in signals being supplied to said column selectors, respectively, the plurality of write-in circuits for respectively writing the plurality of write-in data bits into the non-volatile programmable read only memory device;
    f) a write-in controlling unit responsive to an external controlling signal and sequentially producing a plurality of write-in controlling signals, wherein a time delay is introduced between said plurality of write-in controlling signals; and
    g) a transfer gate array having a plurality of transfer transistors divided into a plurality of transfer gate groups, said transfer gate groups being respectively responsive to said plurality of write-in controlling signals for sequentially transferring said write-in data bits to said plurality of write-in circuits.

6. The non-volatile programmable read only memory device as set forth in claim 5 in which said transfer gate array is coupled between said latching circuits and said write-in circuits for selectively propagating said write-in data bits, said latching circuits being divided into a plurality of latching circuit groups respectively connectable through said plurality of transfer gate groups to said write-in circuits, each of said write-in circuits having a plurality of output nodes so as to sequentially supply said write-in signals indicative of said write-in data bits sequentially fed from said associated latching circuits.

7. The non-volatile programmable read only memory device as set forth in claim 6 wherein the plurality of write-in controlling signals include first and second write-in controlling signals, and wherein said second write-in controlling signal is enabled immediately after said first write-in controlling signal is disabled.

8. The non-volatile programmable read only memory device as set forth in claim 6, in which said non-volatile programmable read only memory device further comprises a shifting unit coupled between said write-in circuits and said column selectors, said shifting unit being operative to propagate said write-in signals to said column selectors, respectively, in a programmable mode, said shifting unit being further operative to transfer data bits read out from one of said column selectors to a sense amplifier circuit.

* * * * *

UNITED STATES PATENT AND TRADEMARK OFFICE
CERTIFICATE OF CORRECTION

PATENT NO. : 5,331,600
DATED : July 19, 1994
INVENTOR(S) : Higuchi

It is certified that error appears in the above-indentified patent and that said Letters Patent is hereby corrected as shown below:

Column 9, line 43, change "response" to --responsive--;
Column 10, line 3, change "to tows" to --in rows--;
        Line 62, change "programmable" to --programming--.

Signed and Sealed this

Twenty-fifth Day of October, 1994

Attest:

BRUCE LEHMAN

Attesting Officer    Commissioner of Patents and Trademarks